(12) United States Patent
Fernald et al.

(10) Patent No.: US 10,056,899 B1
(45) Date of Patent: Aug. 21, 2018

(54) SIGNAL GATING CIRCUIT FOR USE IN DIGITAL CIRCUITS AND METHOD THEREFOR

(71) Applicant: Silicon Laboratories Inc., Austin, TX (US)

(72) Inventors: Kenneth W. Fernald, Cedar Park, TX (US); Chester Yu, Austin, TX (US); Hegong Wei, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/629,318

(22) Filed: Jun. 21, 2017

(51) Int. Cl.
| | |
|---|---|
| *H03K 3/017* | (2006.01) |
| *H03K 17/687* | (2006.01) |
| *H03K 5/159* | (2006.01) |
| *H03K 19/20* | (2006.01) |
| *H03K 5/05* | (2006.01) |

(52) U.S. Cl.
CPC .......... *H03K 17/6872* (2013.01); *H03K 5/05* (2013.01); *H03K 5/159* (2013.01); *H03K 19/20* (2013.01)

(58) Field of Classification Search
CPC ....... H03K 5/05; H03K 5/159; H03K 17/6872
USPC ........ 327/108–112, 170, 172–176, 427, 434, 327/437; 326/82, 83, 87
See application file for complete search history.

(56) References Cited

U.S. PATENT DOCUMENTS

| | | |
|---|---|---|
| 6,781,429 B1 | 8/2004 | Smith |
| 6,924,681 B2 | 8/2005 | Smith |
| 9,685,953 B1 | 6/2017 | Sadowski |
| 2014/0361706 A1* | 12/2014 | Kulkarni ............ H05B 33/0809 315/291 |

OTHER PUBLICATIONS

Steininger, A. (Jan. 17, 2016), Advanced Digital Design GALS Design [PDF]. Retrieved from http://documentslide.com/documents/advanced-digital-design-gals-design-andreas-steininger-vienna-university-of.html, 44 pages.

* cited by examiner

*Primary Examiner* — Thomas Skibinski
(74) *Attorney, Agent, or Firm* — Polansky & Associates, P.L.L.C.; Paul J. Polansky

(57) ABSTRACT

A signal gating circuit includes a logic circuit that receives a stop signal and an input signal and provides an intermediate signal in response, and a pulse stretcher. The pulse stretcher provides an output signal with no pulse when a width of a pulse of the intermediate signal is less than a first amount, with a pulse having a first pulse width that begins after a start of the pulse of the intermediate signal and ends at a predetermined delay thereafter when a pulse width of the intermediate signal is greater than the first amount but less than a second amount, and with a pulse having a second pulse width that begins after the start of the pulse of the intermediate signal and ends after an end of the pulse of the intermediate signal when a pulse width of the intermediate signal is greater than the second amount.

20 Claims, 5 Drawing Sheets

SIGNAL GATING CIRCUIT FOR USE IN DIGITAL CIRCUITS AND METHOD THEREFOR

FIELD OF THE DISCLOSURE

The present disclosure relates generally to digital circuits, and more particularly to digital circuits with asynchronous gating controls.

BACKGROUND

Certain digital devices such as microcontrollers (MCUs) support low-power modes in which a section of the device is effectively disabled to reduce power consumption. One method for disabling a section of a digital device is to disconnect some portion of the section from its power source (thereby reducing both active power and leakage power), while keeping another portion of the section powered in order to maintain the state of the logic. For example, the digital device may disconnect the power to all non-sequential logic gates (e.g. NANDs, NORs, etc.) and some part of sequential logic gates (e.g. flip-flops), but maintain power to another part of the flip-flops in order to retain their state. Such state retention allows the disabled section of the digital device to quickly continue operation starting from this retained state.

In general, the state of the section of the device to be disabled must be frozen prior to disconnecting power from the logic. This state freezing is typically accomplished by first stopping the clock signal provided to the section of logic by setting it to a fixed HIGH or LOW state. Stopping the clock is generally done in a manner that does not generate an invalid clock pulse to the logic, e.g. a clock HIGH or LOW time which is smaller than that required by the various flip-flops used in the logic. Otherwise, the state of the logic can be corrupted.

BRIEF DESCRIPTION OF THE DRAWINGS

The present disclosure may be better understood, and its numerous features and advantages made apparent to those skilled in the art by referencing the accompanying drawings, in which.

Figure 1:
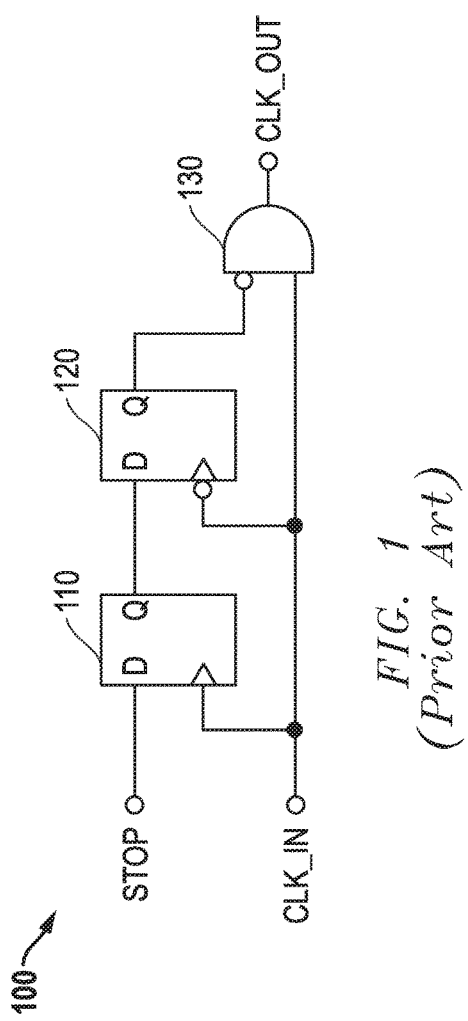
FIG. 1 illustrates in block diagram form a signal gating circuit known in the prior art.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a signal gating circuit for gating an input signal includes a logic circuit and a pulse stretcher. The logic circuit has a first input for receiving a stop signal, a second input for receiving the input signal, and an output for providing an intermediate signal in a first predetermined logic state in response to an activation of the stop signal. The pulse stretcher has an input coupled to the output of the logic circuit, and an output for providing an output signal. The pulse stretcher provides the output signal with no pulse when a width of a pulse of the intermediate signal is less than a first amount. The pulse stretcher provides the output signal with a pulse having a first pulse width that begins after a start of the pulse of the intermediate signal and ends at a predetermined delay after the start of the pulse of the intermediate signal when a pulse width of the intermediate signal is greater than the first amount but less than a second amount. The pulse stretcher provides the output signal with a pulse having a second pulse width that begins after the start of the pulse of the intermediate signal and ends after an end of the pulse of the intermediate signal when a pulse width of the intermediate signal is greater than the second amount.

In another form, a pulse stretcher includes a selective drive circuit, a static latch, a metastability circuit, a dynamic latch, and a delay circuit. The selective drive circuit has an input for receiving an input signal, a control input for receiving a control signal, and an output for providing an output signal in a logic state corresponding to the input signal when the control signal is active, and in a high impedance state when the control signal is inactive. The static latch has an input coupled to the output of the selective drive circuit, and an output. The metastability filter has first and second inputs respectively coupled to the input and output of the static latch, and first and second outputs. The metastability filter provides signals on the first and second outputs in complementary logic states in response to at least a predetermined difference in voltage between the first and second inputs, and in a predetermined logic state otherwise. The dynamic latch has first and second inputs respectively coupled to the first and second outputs of the metastability filter, and an output. The dynamic latch provides a signal on the output thereof in corresponding ones of first and second logic states when the first and second outputs of the metastability filter are in the complementary logic states, and in the high impedance state when the first and second outputs of the metastability filter are in the predetermined logic state. The delay circuit has an input coupled to the output of the dynamic latch, and an output coupled to the control input of the selective drive circuit for providing the control signal.

In yet another form, a method for gating an input signal includes receiving the input signal and a stop signal. An intermediate signal is provided in response to a predetermined logic operation between the input signal and the stop signal. An output signal with no pulse is provided when a width of a pulse of the intermediate signal is less than a first amount. The output signal is provided with a pulse having a first pulse width that begins after a start of the pulse of the intermediate signal and ends at a predetermined delay after the start of the pulse of the intermediate signal when a pulse width of the intermediate signal is greater than the first amount but less than a second amount. The output signal is provided with a pulse having a second pulse width that begins after the start of the pulse of the intermediate signal and ends after an end of the pulse of the intermediate signal when a pulse width of the intermediate signal is greater than the second amount.

FIG. 1 illustrates in block diagram form a signal gating circuit 100 known in the prior art. Signal gating circuit 100 includes flip-flops 110 and 120 and an AND gate 130. Flip-flop 110 is a D-type flip-flop having a D input for receiving a control signal labeled "STOP", a true clock input for receiving a clock signal labeled "CLK_IN", and a Q output. Flip-flop 120 is a D-type flip-flop having a D input connected to the output of flip-flop 110, a complementary clock input for receiving the CLK_IN signal, and a Q output. AND gate 130 has an active-low input connected to the Q output of flip-flop 120, an active-high input for receiving the CLK_IN signal, and an output for providing a gated clock signal labeled "CLK_OUT".

Signal gating circuit 100 attempts to avoid generating an invalid clock signal by waiting for the next falling edge of the CLK_IN signal, and forcing the CLK_OUT signal low with a AND gate 130 once the falling edge is detected. The STOP signal is activated at a logic high to request that the CLK_OUT signal be stopped. Since the STOP signal is assumed to be asynchronous to the CLK_IN and CLK_OUT signals, signal gating circuit 100 uses flip-flops 110 and 120 to generate a version of the STOP signal that is synchronized to the falling edge of the CLK_IN signal.

While signal gating circuit 100 synchronizes the stopping of the clock signal to occur during a less-significant low period, it suffers from another drawback: the device must wait until the STOP signal has propagated through both flip-flops before the CLK_OUT signal is actually stopped. For certain application circuits that use relatively low frequency clock signals (e.g. 32 kHz), signal gating circuit 100 can significantly delay entry into a low-power state, thereby wasting power.

Figure 2:
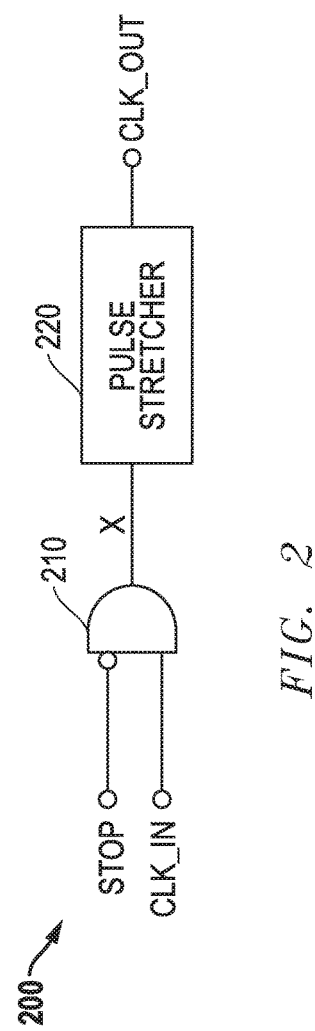
FIG. 2 illustrates in block diagram form a signal gating circuit according to an embodiment of the present invention.

FIG. 2 illustrates in block diagram form a signal gating circuit 200 according to an embodiment of the present invention. Signal gating circuit 200 includes an AND gate 210 and a pulse stretcher 220. AND gate 210 has an active-low input for receiving the STOP signal, an active-high input for receiving the CLK_IN signal, and an output for providing an intermediate signal labeled "X". Pulse stretcher 220 has an input connected to the output of AND gate 210, and an output for providing the CLK_OUT signal.

Signal gating circuit 200 generally gates the input signal (CLK_IN) to provide the output signal (CLK_OUT) as follows. Without any significant added delay, signal gating circuit 200 first (and generally asynchronously) gates the input signal to a desired logic state. In signal gating circuit 200, AND gate 210 asynchronously gates the CLK_IN signal to provide intermediate signal X in a logic low state in response to the activation of the STOP signal, and to provide the intermediate signal at the logic state of the CLK_IN signal when the STOP signal is inactive in a logic low state. In other embodiments, the input signal could be gated to provide the intermediate signal in a logic high state using, e.g., an OR gate. Signal gating circuit 200 then uses pulse stretcher 220 to guarantee that any invalid clock pulse generated by the gating operation of AND gate 210 is either removed or stretched to form a valid clock pulse.

When AND gate 210 provides the intermediate signal with a pulse width less than a first amount, pulse stretcher 220 provides the CLK_OUT signal with no pulse, i.e. it suppresses any pulse that is so short that pulse stretcher 220 cannot reliably stretch the pulse to generate a valid clock pulse at its output.

When AND gate 210 provides the intermediate signal with a pulse width greater than the first amount but less than a second amount, pulse stretcher 220 provides the CLK_OUT signal with a pulse that begins after (and in response to) a start of the intermediate signal pulse, and ends at a predetermined delay after the start of the intermediate signal pulse. In this way pulse stretcher 220 ensures the pulse width at its output is sufficiently long to prevent any malfunction, e.g. by providing a width sufficient to meet the timing requirements of the clocked circuits.

When AND gate 210 provides the intermediate signal with a pulse width greater than the second amount, pulse stretcher 220 provides the CLK_OUT signal with a pulse that begins after (and in response to) the start of the intermediate signal pulse, and ends after (and in response to) an end of the intermediate signal pulse.

Thus, signal gating circuit 200 quickly and efficiently stops the CLK_IN signal without generating an invalid clock pulse to the clocked logic. In other embodiments, signal gating circuit 200 can be used to gate other types of control signals besides periodic clock signals with the same advantageous effects, such as reset signals and control signals to circuitry which is sensitive to the width of its incoming controls signals. Examples of the latter include some analog oscillator circuits, which may require a minimum inactive period on their enable control signal to guarantee a deterministic startup behavior when the analog oscillator is next enabled.

Figure 3:
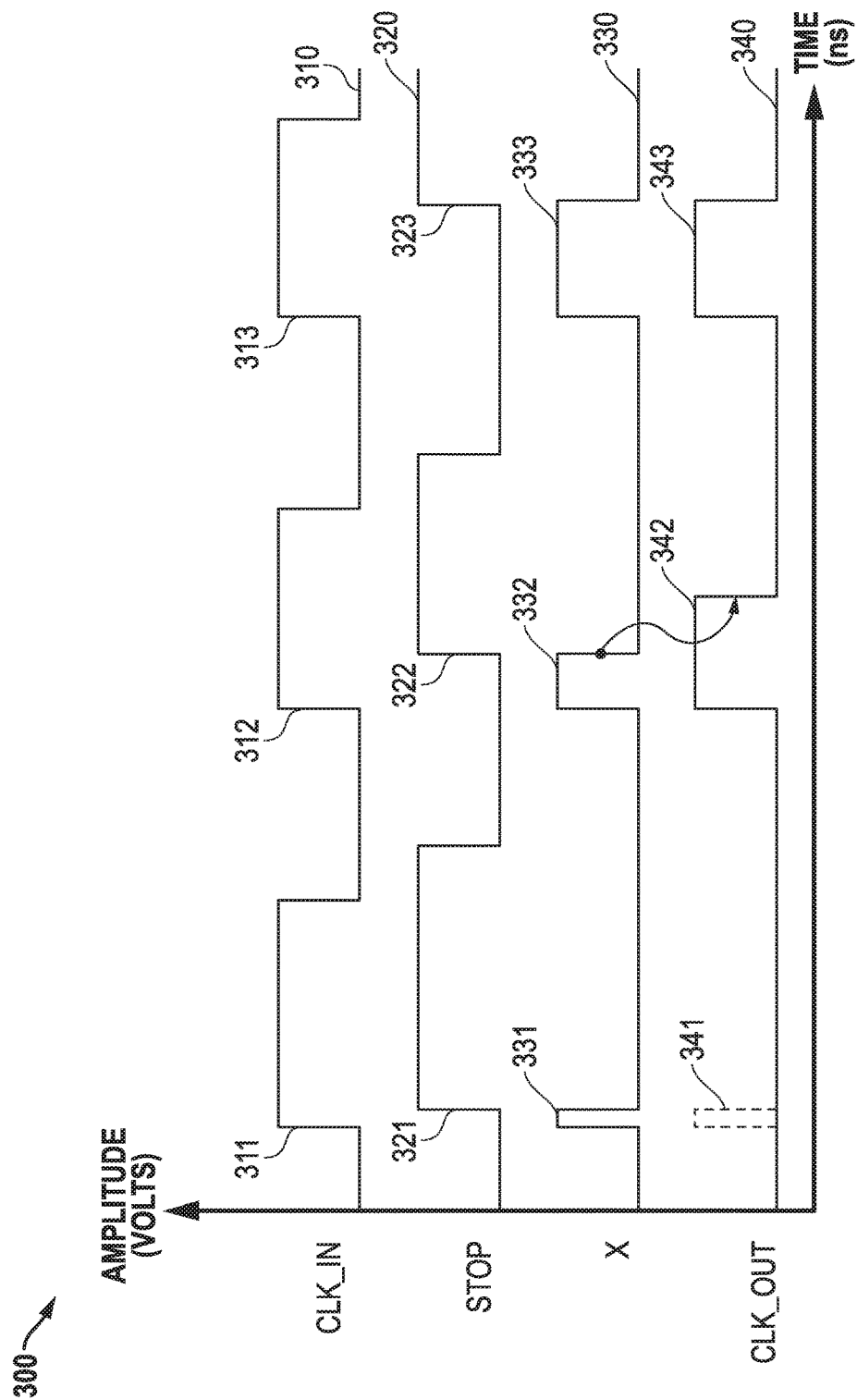
FIG. 3 illustrates a timing diagram showing the operation of the signal gating circuit of FIG. 2.

FIG. 3 illustrates a timing diagram 300 showing the operation of signal gating circuit 200 of FIG. 2. In timing diagram 300, the horizontal axis represents time in nanoseconds (ns), and the vertical axis represents the amplitude of various signals in volts. Timing diagram 300 shows four waveforms of interest, including a waveform 310 of the CLK_IN signal, a waveform 320 of the STOP signal, a waveform 330 of the intermediate signal, and a waveform 340 of the CLK_OUT signal.

In the illustrated timing diagram, the CLK_IN signal is a periodic clock signal having approximately 50% duty cycle. In target applications, the low-to-high transition of the CLK_IN signal is frequently used in clocked logic circuits. Waveform 310 illustrates three low-to-high transitions 311-313 of the CLK_IN signal. Likewise, waveform 320 illustrates three low-to-high transitions 321-323 of the STOP signal, each having a different offset from a corresponding low-to-high transition of the CLK_IN signal. Note that FIG. 3 simplifies the discussion by illustrating three activations of the STOP signal after consecutive pulses of the CLK_IN signal, but in an actual embodiment there would likely be a considerable passage of time between consecutive activations of the STOP signal.

The first low-to-high transition 321 of the STOP signal occurs very shortly after the corresponding low-to-high transition 311 of the CLK_IN signal. AND gate 210 provides intermediate signal X as a very short pulse 331 whose rising edge is triggered by low-to-high transition 311, and whose falling edge is triggered by low-to-high transition 321 of the STOP signal. In this case, pulse stretcher 220 suppresses a pulse 341 of the CLK_OUT signal, which is shown with dashed lines. Thus pulse stretcher 220 provides the CLK_OUT signal with no pulse until after the next low-to-high transition of the CLK_IN signal (assuming the STOP signal is inactive) because the width of the intermediate signal is too short for pulse stretcher 220 to reliably stretch to a valid width. This suppression of such a pulse by pulse stretcher 220 may result due to the limited response time of the circuitry pulse stretcher 220, as understood by persons skilled in the art.

The second low-to-high transition 322 of the STOP signal occurs a longer amount of time after the corresponding low-to-high transition 312 of the CLK_IN signal than the low-to-high transition 321 of the STOP signal did relative to low-to-high transition 311 of the CLK_IN signal. AND gate 210 provides intermediate signal X as a pulse 332 of intermediate duration, that is the width of pulse 332 is greater than the first amount but less than a second amount. Pulse stretcher 220 provides a pulse 342 of the CLK_OUT signal with a rising edge triggered by low-to-high transition 312, and a falling edge that occurs a certain delay after the rising edge. In this case, pulse stretcher 220 extends the high-to-low transition of pulse 342 past the low-to-high transition 322 of the STOP signal and past the high-to-low transition of intermediate signal X. Thus pulse stretcher 220 provides pulse 342 of the CLK_OUT signal having a second pulse width that begins after (and in response to) a low-to-high transition of intermediate signal X, and ends at the predetermined delay after the start of the pulse 342 of the CLK_OUT signal.

The third low-to-high transition 323 of the STOP signal occurs an even longer time after the corresponding low-to-high transition 313 of the CLK_IN signal than the second low-to-high transition 322 of the STOP signal did relative to low-to-high transition 312 of the CLK_IN signal. AND gate 210 provides intermediate signal X as a pulse of a relatively long duration, that is the pulse width of intermediate signal X is greater than the second amount. The rising edge of pulse 343 is triggered by (and in response to) low-to-high transition 313, while the falling edge is triggered by (and in response to) the low-to-high transition of the STOP signal. In this case, pulse stretcher 220 allows the STOP signal to disable the CLK_OUT signal nearly immediately, since the width of intermediate signal X is long enough, i.e. it is greater than the second amount.

Thus signal gating circuit 200 allows the STOP signal to stop the generation of the CLK_OUT signal while preventing the propagation of short CLK_OUT pulses that may cause circuit malfunction, but while allowing the STOP signal to stop the CLK_OUT pulse nearly immediately after the activation of the STOP signal when doing so would not cause the generation of a pulse that is so short that it may cause circuits to malfunction.

As described above, timing diagram 300 illustrates a scenario where high-going pulses of various durations are generated at intermediate signal X. However, a signal gating circuit according to other embodiments may also perform an analogous function with respect to low-going pulses, i.e. pulses which start with a high-to-low transition and end with a low-to-high transition.

Figure 4:
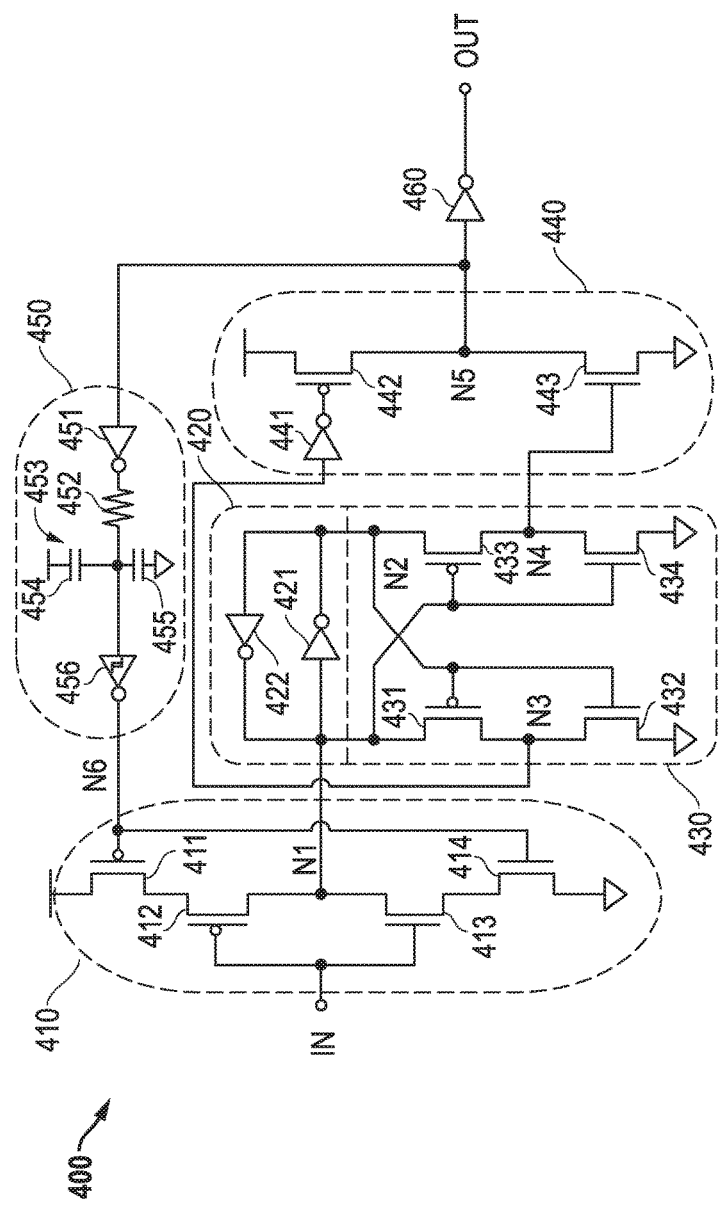
FIG. 4 illustrates in partial block diagram and partial schematic form a pulse stretcher that can be used as the pulse stretcher of FIG. 2.

FIG. 4 illustrates in partial block diagram and partial schematic form a pulse stretcher 400 that can be used as pulse stretcher 220 of FIG. 2. Pulse stretcher 400 includes generally a selective drive circuit 410, a static latch 420, a metastability filter 430, a dynamic latch 440, a delay circuit 450, and an output inverter 460.

Selective drive circuit 410 includes transistors 411-414. Transistor 411 is a P-channel MOS transistor having a source connected to a positive power supply voltage terminal, a gate connected to a node labeled "N6", and a drain. Transistor 412 is a P-channel MOS transistor having a source connected to the drain of transistor 411, a gate for receiving an input signal labeled "IN", and a drain connected to a node labeled "N1". Transistor 413 is an N-channel MOS transistor having a drain connected to node N1, a gate for receiving the IN signal, and a source. Transistor 414 is an N-channel MOS transistor having a drain connected to the source of transistor 413, a gate connected to node N6, and a source connected to ground.

Static latch 420 includes inverters 421 and 422. Inverter 421 has an input connected to node N1, and an output connected to a node labeled "N2". Inverter 422 has an input connected to node N2, and an output connected to node N1.

Metastability filter 430 includes transistors 431-434. Transistor 431 is a P-channel MOS transistor having a source connected to node N1, a gate connected to node N2, and a drain connected to a node labeled "N3". Transistor 432 is an N-channel MOS transistor having a drain connected to node N3, a gate connected to node N2 and a source connected to ground. Transistor 433 is a P-channel MOS transistor having a source connected to node N2, a gate connected to node N1, and a drain connected to a node labeled "N4". Transistor 434 is an N-channel MOS transistor having a drain connected to node N4, a gate connected to node N1, and a source connected to ground.

Dynamic latch 440 includes an inverter 441 and transistors 442 and 443. Inverter 441 has an input connected to node N3, and an output. Transistor 442 is a P-channel MOS transistor having a source connected to the positive power supply voltage terminal, a gate connected to the output of inverter 441, and a drain connected to a node labeled "N5". Transistor 443 is an N-channel MOS transistor having a drain connected to node N5, a gate connected to node N4 and a source connected to ground.

Delay circuit 450 includes an inverter 451, a resistor 452, a capacitive divider 453, and a hysteresis inverter 456. Inverter 451 has an input connected to node N5, and an output. Resistor 452 has a first terminal connected to the output of inverter 451, and a second terminal. Capacitive divider 453 includes capacitors 454 and 455. Capacitor 454 has a first terminal connected to the positive power supply voltage terminal and a second terminal connected to the second terminal of resistor 452. Capacitor 455 has a first terminal connected to the second terminal of resistor 452, and a second terminal connected to ground. Hysteresis inverter 456 has an input connected to the second terminal of resistor 452, and an output connected to node N6.

Output inverter 460 has an input connected to node N5, and an output for providing a signal labeled "OUT".

When pulse stretcher 400 is used in signal gating circuit 200 of FIG. 2, the IN signal is intermediate signal X, and the OUT signal is the CLK_OUT signal. Pulse stretcher 400 exhibits the behavior described above for pulse stretcher 220, namely it provides the OUT signal with no pulse when a width of a pulse of the IN signal is less than a first amount, provides the OUT signal with a pulse having a first pulse width that begins after a start of the pulse of the IN signal and ends at a certain delay after the start of the pulse of the IN signal, when a pulse width of the IN signal is greater than the first amount but less than a second amount, and provides the OUT signal with a pulse having a second pulse width that begins after the start of the pulse of the IN signal and ends after an end of the pulse of the IN signal, when a pulse width of the IN signal is greater than the second amount.

The first amount relates to the response time and speed of the circuitry of the pulse stretcher, while the second amount is a portion of a period of the CLK_IN signal that is related to the electrical requirements for setup and hold time for reliable operation of the circuits in the process technology being used.

Selective drive circuit 410 is an inverting stage that selectively drives node N1 high when the IN signal is low and the voltage on node N6 is also low, selectively drives node N1 low when the IN signal is high and the voltage on node N6 is also high, and places its output in a high impedance state otherwise. Selective drive circuit 410 is thus an inverting stage, but in other embodiments could be non-inverting as well. Transistor 411 whose gate is connected to node N6 and transistor 412 that receives the IN signal are connected in series between the positive power supply voltage terminal and node N1, but in other embodiments their order could be reversed. Likewise transistor 413 that receives the IN signal and transistor 414 whose gate is connected to node N6 are connected in series between node N1 and ground, but in other embodiments their order could be reversed as well.

Static latch 420 latches and reinforces the state on node N1 using back-to-back inverters 421 and 422. The outputs of static latch 420, i.e. nodes N1 and N2, are connected to metastability filter 430 to prevent illegal logic states due to nodes N1 and N2 remaining near the switchpoints of inverters 421 and 422 from propagating to dynamic latch 440. Nodes N3 and N4 drive a dynamic latch 440, whose state determines the output state of pulse stretcher 400. The voltage on the output of dynamic latch 440, at node N5, also provides the feedback signal through delay circuit 450 to develop the voltage on node N6. In the illustrated embodiment, the input capacitance of output inverter 460 holds the state of dynamic latch 440 when the latch is in its high-impedance state. In other embodiments, an explicit capacitor can be used for this purpose.

Delay circuit 450 provides an appropriate delay that determines when pulse stretcher 400 is able to recognize the next transition of the IN signal. Moreover, by splitting the required capacitance into two capacitors, e.g. capacitors 454 and 455, where the capacitors act as a capacitive divider of the power supply voltage, delay circuit 450 is less sensitive to transients on the power supply level since the switching threshold of hysteresis inverter 456 is also approximately a divide-by-2 of the power supply voltage. Other embodiments may omit capacitor 454 or 455.

Figure 5:
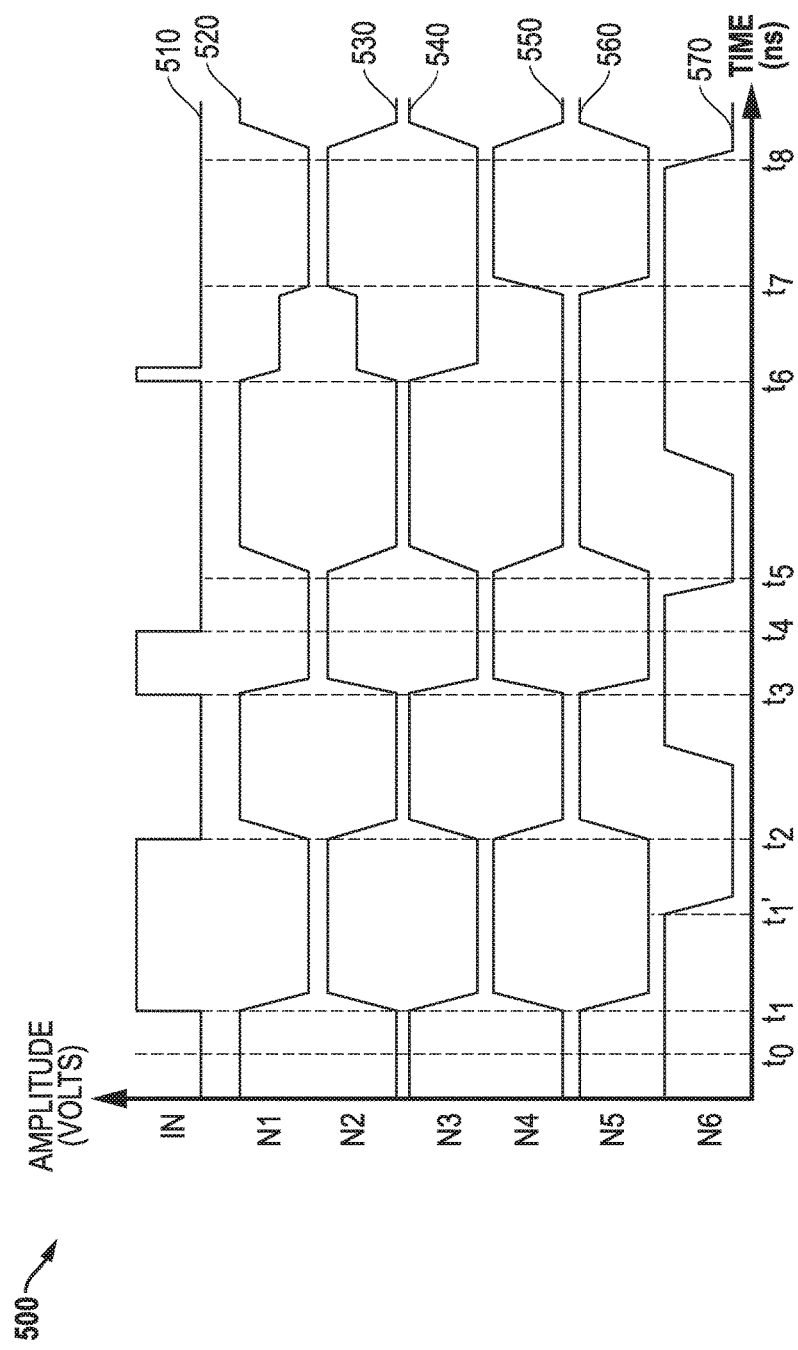
FIG. 5 illustrates a timing diagram showing the operation of the pulse stretcher of FIG. 4.

FIG. 5 illustrates a timing diagram 500 showing the operation of pulse stretcher 400 of FIG. 4. In timing diagram 500, the horizontal axis represents time in ns, and the vertical axis represents the amplitude of various signals in volts. Timing diagram 500 shows seven waveforms of interest, including a waveform 510 of the IN signal, a waveform 520 of the voltage at node N1, a waveform 530 of the voltage at node N2, a waveform 540 of the voltage at node N3, a waveform 550 of the voltage at node N4, a waveform 560 of the voltage at node N5, and a waveform 570 of the voltage at node N6. Timing diagram 500 also shows ten points in time of interest, namely times $t_0$, $t_1$, $t_1'$, $t_2$, $t_3$, $t_4$, $t_5$, $t_6$, $t_7$, and $t_8$. Timing diagram 500 simplifies the description of the operation by illustrating three activations of the IN signal of three different widths. In an actual embodiment such as a clock gating circuit, however, there would likely be a considerable passage of time between consecutive activations of the STOP signal. Also, for clarity timing diagram 500 does not purport to illustrate the relatively short propagation delays through the forward path of pulse stretcher 400 due to speed limitations of a given technology.

First consider the IN signal having a relatively large pulse width, for example due to the STOP signal being inactive if pulse stretcher 400 is used in signal gating circuit 200. At time $t_0$, at which pulse stretcher 400 is in a stable state, the IN signal is low, nodes N1, N3, N5 and N6 are high, and nodes N2 and N4 are low. The high level on node N6 makes transistor 414 conductive, such that the low-to-high transition of the IN signal at time $t_1$ causes selective drive circuit 410 to drive node N1 low. In response to node N1 going low, inverter 421 drives node N2 high, and inverter 422 inverts the high voltage to reinforce the low voltage on node N1. Since selective drive circuit 410 quickly discharges node N1 through transistors 413 and 414 to ground and inverter 421 quickly inverts the low voltage to drive node N2 high, metastability filter 430 provides node N3 at a logic low and node N4 at a logic high shortly thereafter. These voltages make transistor 442 non-conductive and transistor 443 conductive and thus dynamic latch 440 drives node N5 low. However delay circuit 450 delays the falling edge of node N6 until time $t_1'$. The falling edge of N6 at $t_1'$ disables transistor 414, but not before static latch 420 captures the low level on node N1 and reinforces it through inverter 422. At time $t_2$, the IN signal returns to a logic low, causing nodes N1, N3, N5 and (after a delay) N6 to again be high, while nodes N2 and N4 to be low. In this case, the pulse width of the IN signal is the time period between times $t_1$ and $t_2$, and it exceeds the time between $t_1$ and $t_1'$. Thus for a pulse width longer than the time from $t_1$ to $t_1'$, pulse stretcher 400 provides the OUT signal with a pulse that begins after (and in response to) the start of said pulse of the IN signal and ends after (and in response to) an end of the pulse of the IN signal.

Next, consider the case in which the IN signal has a shorter pulse width, for example due to the STOP signal becoming active after a low-to-high transition of the IN signal if pulse stretcher 400 is used in signal gating circuit 200 but for a period of time less than the time from $t_1$ to $t_1'$. Thus for example the IN signal goes high at $t_3$ and then goes low at $t_4$.

Before time $t_3$, the IN signal is low, nodes N1, N3, N5 and N6 are high, and nodes N2 and N4 are low. The high level on node N6 makes transistor 414 conductive, such that the low-to-high transition of the IN signal at time $t_3$ causes selective drive circuit 410 to drive node N1 low. In response to node N1 going low, nodes N2 and N4 go high, and nodes N3 and N5 go low. However because of the delay of delay circuit 450, node N6 does not go low until time $t_5$, which occurs after the high-to-low transition of the IN signal at time $t_4$. Until node N6 goes low, selective drive circuit 410 is not configured to drive node N1 high in response to the IN signal going low at time $t_4$. Thus the propagation of the high-to-low transition of the IN signal at time $t_4$ is delayed until after the falling edge of node N6, which itself occurs a delay time after the rising edge of the IN signal. The delay time is determined primarily by the drive strength of inverter 451, the values of resistor 452 and capacitors 454 and 455, and the threshold of hysteresis inverter 456. Thus for a pulse width shorter than the time from $t_3$ to $t_5$ but longer than a certain smaller amount, pulse stretcher 400 provides the OUT signal with a pulse that begins after (and in response to) the start of said pulse of the IN signal, and ends at a predetermined delay after the start of the pulse of the IN signal.

Finally, consider the case in which the IN signal has an even shorter pulse width, for example due to the STOP signal becoming active almost immediately after a low-to-high transition of the IN signal if pulse stretcher 400 is used in signal gating circuit 200. In this case, the IN signal goes high at $t_6$ and then goes low almost immediately after. In response to the low-to-high transition of the IN signal, selective drive circuit 410 starts to drive node N1 low.

However the falling edge of the IN signal just after time $t_6$ causes selective drive circuit 410 to stop driving the N1 node, leaving the N1 node at a voltage very near the switching threshold of inverter 421, indicated by the midscale level of the N1 signal between times $t_6$ and $t_7$. This in turn causes the output of inverter 421 at node N2 to be very near the switching threshold of inverter 422, also causing its output at node N1 to be very near the switching threshold of inverter 421. As such, static latch 420 can be considered to be in a metastable state between times $t_6$ and $t_7$. Metastability filter 430 recognizes this metastable state by detecting that nodes N1 and N2 are at nearly equal voltages, causing metastability filter 430 to drive both nodes N3 and N4 into logic low states. The logic low voltages on nodes N3 and N4 keep both transistors 442 and 443 non-conductive, and thus node N5 is not driven to any logic state. Since it is a high impedance node, node N5 retains its voltage throughout this period. Static latch 420 remains in a metastable state until $t_7$, at which time it resolves to N1 low and N2 high. At this point metastability filter 430 propagates the new state of static latch 420 to dynamic latch 440, causing node N5 to change state at time $t_7$.

FIG. 5 described above illustrates operation of pulse stretcher 400 in response to high-going pulses, i.e. pulses which begin with a low-to-high transition and end with a high-to-low transition. Pulse stretcher 400 also provides analogous, complementary operation for low-going pulses, i.e. pulses which begin with a high-to-low transition and end with a low-to-high transition. In other words, pulse stretcher 400 either rejects or stretches both high-going and low-going pulses according to the general principles described above.

As shown in FIG. 4, delay circuit 450 generates an RC delay that triggers the generation of its output voltage at node N6 when the voltage on capacitors 454 and 455 reaches the switching threshold (about one-half of the power supply voltage) of hysteresis inverter 456. After hysteresis inverter 456 changes logic state, the voltage on the capacitors continues to ramp toward the supply or ground potential, depending on the polarity of the input signal. Once the voltage on the capacitors has substantially reached the supply or ground potential, delay circuit 450 is prepared to time the next delay period associated with an incoming pulse to the pulse stretcher. However, if an incoming pulse occurs while the delay circuit's capacitor voltage is still ramping toward supply or ground, as described above, then the delay circuit does not generate the correct delay and the pulse stretcher can fail to correctly limit its output pulse width. To solve this potential problem, the pulse stretcher can use a cascade of two special delay circuits known here as speed-up delay circuits, each with a speed-up feature to accelerate the ramp rate after the output inverter of each speed-up delay circuit trips. An embodiment of one of the cascaded speed-up delay circuits will now be described.

Figure 6:
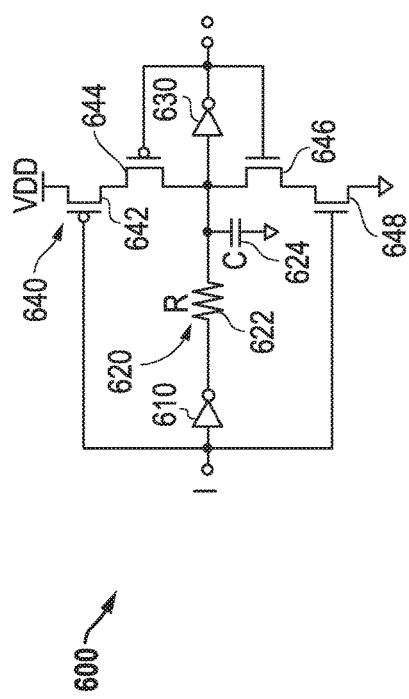
FIG. 6 illustrates in partial block diagram and partial schematic form a speed-up delay circuit that can be used in the delay circuit of the pulse stretcher of FIG. 4.

FIG. 6 illustrates in partial block diagram and partial schematic form a speed-up delay circuit 600 that can be used in delay circuit 450 of pulse stretcher 400 of FIG. 4. Speed-up delay circuit 600 includes generally an inverter 610, a resistor-capacitor (RC) network 620, an inverter 630, and a feedback circuit 640. Inverter 610 has an input for receiving an input signal labeled "I", and an output. RC network 620 includes a resistor 622 and a capacitor 624. Other embodiments may substitute a capacitive divider for capacitor 624, similar to capacitors 454 and 455 shown in FIG. 4. Resistor 622 has a first terminal connected to the output of inverter 610, and a second terminal. Capacitor 624 has a first terminal connected to the second terminal of resistor 622, and a second terminal connected to ground. Inverter 630 has an input connected to the second terminal of resistor 622, and a second terminal for providing an output signal labeled "O". Feedback circuit 640 includes transistors 642, 644, 646, and 648. Transistor 642 is a P-channel MOS transistor having a source connected to the positive power supply voltage terminal, a gate for receiving the I signal, and a drain. Transistor 644 is a P-channel MOS transistor having a source connected to the drain of transistor 642, a gate for receiving the O signal, and a drain connected to the second terminal of resistor 622. Transistor 646 is an N-channel MOS transistor having a drain connected to the second terminal of resistor 622, a gate for receiving the O signal, and a source. Transistor 648 is an N-channel MOS transistor having a drain connected to the source of transistor 646, a gate for receiving the I signal, and a source connected to ground.

Speed-up delay circuit 600 is similar to delay circuit 450 in pulse stretcher 400, but includes feedback circuit 640 that quickly pulls the voltage on capacitor 624 to the positive power supply terminal or to ground once inverter 630 triggers.

Figure 7:
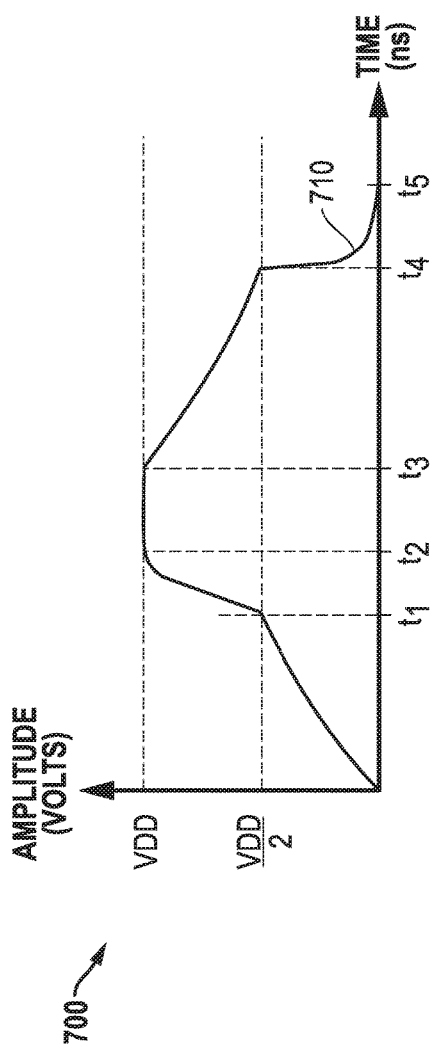
FIG. 7 illustrates a timing diagram showing the operation of the speed-up delay circuit of FIG. 6.

FIG. 7 illustrates a timing diagram 700 showing the operation of speed-up delay circuit 600 of FIG. 6. In timing diagram 700, the horizontal axis represents time in ns, and the vertical axis represents amplitude in volts. Timing diagram 700 shows a waveform 710 of the voltage on the first terminal of capacitor 624 relative to ground. Timing diagram 700 also shows five points in time of interest, $t_1$, $t_2$, $t_3$, $t_4$, and $t_5$, and two voltages of interest, $V_{DD}$ and $V_{DD}/2$. Waveform 710 starts out with capacitor 624 fully discharged at about 0 volts. In response to a high-to-low transition of the I signal, inverter 610 causes the voltage on the first terminal of capacitor 624 to ramp up according to an RC time constant determined primarily by the values of resistor 622 and capacitor 624. When the voltage of the first terminal of capacitor 624 reaches $V_{DD}/2$ at time $t_1$, however, the output of inverter 630 goes low, and feedback circuit 640 pulls the first terminal of capacitor 624 rapidly to $V_{DD}$ through transistors 642 and 644, and thus the voltage on the first terminal of capacitor 624 rapidly reaches $V_{DD}$ at time $t_2$ due to the relatively high drive capability of transistors 642 and 644.

In response to a low-to-high transition on the I signal at around time $t_3$, inverter 610 causes the voltage on the first terminal of capacitor 624 to drop according to the RC time constant determined primarily by the values of resistor 622 and capacitor 624. When this voltage reaches $V_{DD}/2$ at time $t_4$, however, the output of inverter 630 goes high, and feedback circuit 640 pulls the first terminal of capacitor 624 rapidly to ground through transistors 646 and 648, and the voltage on the first terminal of capacitor 624 rapidly reaches ground at time $t_5$ due to the relatively high drive capability of transistors 646 and 648.

If two of these speed-up delay circuits are cascaded to form the feedback circuit in pulse stretcher 400, they achieve the desired overall delay in which each speed-up delay circuit achieves about half the desired overall delay. The delay of the second cascaded speed-up delay circuit provides the time necessary for the first speed-up delay circuit to settle its capacitor voltage to the power supply voltage or to ground as the case may be, and thereby become ready to time a delay associated with the next incoming pulse to the pulse stretcher. By virtue of cascading two delay circuits, each with a speed-up feature, the pulse stretcher ensures a sufficiently large pulse width at its outputs regardless of the time between incoming pulses.

The above-disclosed subject matter is to be considered illustrative, and not restrictive, and the appended claims are intended to cover all such modifications, enhancements, and other embodiments that fall within the true scope of the claims. For example, the pulse stretcher can use a conventional delay circuit, or special speed-up delay circuits that avoid the problem of a pulse that arrives too early. The order of the signals provided to the gates of the pullup and pulldown pairs of transistors in selective drive circuit 410 and feedback circuit 640 can also be reversed. Moreover the logic circuit used to develop the intermediate signal in signal gating circuit 200 can set the output to either a logic low or a logic high in response to the activation of the STOP signal using an appropriate logic gate. While the signal gating logic was described in terms of a periodic clock gating circuit, it can be used to gate other similar signals. Moreover the pulse stretcher itself can be used in other types of circuits.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A signal gating circuit for gating an input signal, comprising:
    a logic circuit having a first input for receiving a stop signal, a second input for receiving the input signal, and an output for providing an intermediate signal in a first predetermined logic state in response to an activation of said stop signal; and
    a pulse stretcher having an input coupled to said output of said logic circuit, and an output for providing an output signal, wherein said pulse stretcher:
        provides said output signal with no pulse, when a width of a pulse of said intermediate signal is less than a first amount;
        provides said output signal with a pulse having a first pulse width that begins after a start of said pulse of said intermediate signal and ends at a predetermined delay after said start of said pulse of said intermediate signal, when a pulse width of said intermediate signal is greater than said first amount but less than a second amount; and
        provides said output signal with a pulse having a second pulse width that begins after said start of said pulse of said intermediate signal and ends after an end of said pulse of said intermediate signal, when a pulse width of said intermediate signal is greater than said second amount.

2. The signal gating circuit of claim 1, wherein said pulse stretcher comprises:
    a selective drive circuit having an input for receiving said intermediate signal, a control input for receiving a control signal, and an output for providing an output signal in a logic state corresponding to said intermediate signal when said control signal is active, and in a high impedance state when said control signal is inactive;
    a static latch having an input coupled to said output of said selective drive circuit, and an output;
    a metastability filter having first and second inputs respectively coupled to said input and output of said static latch, and first and second outputs, wherein said metastability filter provides signals on said first and second outputs in complementary logic states in response to at least a predetermined difference in voltage between said first and second inputs, and in a second predetermined logic state otherwise;
    a dynamic latch having first and second inputs respectively coupled to said first and second outputs of said metastability filter, and an output, wherein said dynamic latch provides a signal on said output thereof in corresponding ones of first and second logic states when said first and second outputs of said metastability filter are in said complementary logic states, and in said high impedance state when said first and second outputs of said metastability filter are in said second predetermined logic state; and
    a delay circuit having an input coupled to said output of said dynamic latch, and an output coupled to said control input of said selective drive circuit for providing said control signal.

3. The signal gating circuit of claim 2, wherein said selective drive circuit comprises:
    a first pair of transistors coupled between a first power supply voltage terminal and said output of said selective drive circuit, wherein said first pair of transistors comprises a first transistor having a control electrode for receiving said control signal in series with a second transistor having a control electrode for receiving said input signal; and
    a second pair of transistors coupled between said output of said selective drive circuit and a second power supply voltage terminal, wherein said second pair of transistors comprises a third transistor having a control electrode for receiving said input signal in series with a fourth transistor having a control electrode for receiving said control signal.

4. The signal gating circuit of claim 3, wherein said first power supply voltage terminal provides a positive power supply voltage with respect to said second power supply voltage terminal, said first and second transistors comprise P-channel metal-oxide-semiconductor (MOS) transistors, and said third and fourth transistors comprise N-channel MOS transistors.

5. The signal gating circuit of claim 2, wherein said static latch comprises:
    a first inverter having an input coupled to said input of said static latch, and an output coupled to said output of said static latch; and
    a second inverter having an input coupled to said output of said static latch, and an output coupled to said input of said static latch.

6. The signal gating circuit of claim 2, wherein said metastability filter comprises:
    a first transistor having a first current electrode coupled to said first input of said metastability filter, a control electrode coupled to said second input of said metastability filter, and a second current electrode coupled to said first output of said metastability filter;
    a second transistor having a first current electrode coupled to said second current electrode of said first transistor, a control electrode coupled to said second input of said metastability filter, and a second current electrode coupled to a second power supply voltage terminal;
    a third transistor having a first current electrode coupled to said second input of said metastability filter, a control electrode coupled to said first input of said metastability filter, and a second current electrode coupled to said second output of said metastability filter; and
    a fourth transistor having a first current electrode coupled to said second current electrode of said third transistor, a control electrode coupled to said first input of said metastability filter, and a second current electrode coupled to said second power supply voltage terminal.

7. The signal gating circuit of claim 6, wherein said first and third transistors comprise P-channel MOS transistors, and said second and fourth transistors comprise N-channel MOS transistors.

8. The signal gating circuit of claim 2, wherein said dynamic latch comprises:
   an inverter having an input coupled to said first output of said metastability filter, and an output;
   a first transistor having a first current electrode coupled to a first power supply voltage terminal, a control electrode coupled to said output of said inverter, and a second current electrode coupled to output of said dynamic latch; and
   a second transistor having a first current electrode coupled to said second current electrode of said first transistor, a control electrode coupled to said second output of said metastability filter, and a second current electrode coupled to a second power supply voltage terminal.

9. The signal gating circuit of claim 2, wherein said delay circuit comprises at least one speed-up delay circuit, each speed-up delay circuit comprising:
   a first inverter having an input coupled to said output of said dynamic latch, and an output;
   an RC network having an input coupled to said output of said first inverter, and an output;
   a second inverter having an input coupled to said output of said RC network, and an output;
   a first pair of transistors coupled between a first power supply voltage terminal and said input of said second inverter, wherein said first pair of transistors comprises a first transistor having a control electrode for receiving said input signal in series with a second transistor having a control electrode coupled to said output of said second inverter; and
   a second pair of transistors coupled between said input of said second inverter and a second power supply voltage terminal, wherein said second pair of transistors comprises a third transistor having a control electrode coupled to said output of said second inverter in series with a fourth transistor having a control electrode for receiving said input signal.

10. A pulse stretcher comprising:
    a selective drive circuit having an input for receiving an input signal, a control input for receiving a control signal, and an output for providing an output signal in a logic state corresponding to said input signal when said control signal is active, and in a high impedance state when said control signal is inactive;
    a static latch having an input coupled to said output of said selective drive circuit, and an output;
    a metastability filter having first and second inputs respectively coupled to said input and output of said static latch, and first and second outputs, wherein said metastability filter provides signals on said first and second outputs in complementary logic states in response to at least a predetermined difference in voltage between said first and second inputs, and in a predetermined logic state otherwise;
    a dynamic latch having first and second inputs respectively coupled to said first and second outputs of said metastability filter, and an output, wherein said dynamic latch provides a signal on said output thereof in corresponding ones of first and second logic states when said first and second outputs of said metastability filter are in said complementary logic states, and in said high impedance state when said first and second outputs of said metastability filter are in said predetermined logic state; and
    a delay circuit having an input coupled to said output of said dynamic latch, and an output coupled to said control input of said selective drive circuit for providing said control signal.

11. The pulse stretcher of claim 10, wherein said selective drive circuit comprises:
    a first pair of transistors coupled between a first power supply voltage terminal and said output of said selective drive circuit, wherein said first pair of transistors comprises a first transistor having a control electrode for receiving said control signal in series with a second transistor having a control electrode for receiving said input signal; and
    a second pair of transistors coupled between said output of said selective drive circuit and a second power supply voltage terminal, wherein said second pair of transistors comprises a third transistor having a control electrode for receiving said input signal in series with a fourth transistor having a control electrode for receiving said control signal.

12. The pulse stretcher of claim 11, wherein said first power supply voltage terminal provides a positive power supply voltage with respect to said second power supply voltage terminal, said first and second transistors comprise P-channel metal-oxide-semiconductor (MOS) transistors, and said third and fourth transistors comprise N-channel MOS transistors.

13. The pulse stretcher of claim 10, wherein said static latch comprises:
    a first inverter having an input coupled to said input of said static latch, and an output coupled to said output of said static latch; and
    a second inverter having an input coupled to said output of said static latch, and an output coupled to said input of said static latch.

14. The pulse stretcher of claim 10, wherein said metastability filter comprises:
    a first transistor having a first current electrode coupled to said first input of said metastability filter, a control electrode coupled to said second input of said metastability filter, and a second current electrode coupled to said first output of said metastability filter;
    a second transistor having a first current electrode coupled to said second current electrode of said first transistor, a control electrode coupled to said second input of said metastability filter, and a second current electrode coupled to a power supply voltage terminal;
    a third transistor having a first current electrode coupled to said second input of said metastability filter, a control electrode coupled to said first input of said metastability filter, and a second current electrode coupled to said second output of said metastability filter; and
    a fourth transistor having a first current electrode coupled to said second current electrode of said third transistor, a control electrode coupled to said first input of said metastability filter, and a second current electrode coupled to said power supply voltage terminal.

15. The pulse stretcher of claim 14, wherein said first and third transistors comprise P-channel MOS transistors, and said second and fourth transistors comprise N-channel MOS transistors.

16. The pulse stretcher of claim 10, wherein said dynamic latch comprises:

an inverter having an input coupled to said first output of said metastability filter, and an output;

a first transistor having a first current electrode coupled to a first power supply voltage terminal, a control electrode coupled to said output of said inverter, and a second current electrode coupled to output of said dynamic latch; and a second transistor having a first current electrode coupled to said second current electrode of said first transistor, a control electrode coupled to said second output of said metastability filter, and a second current electrode coupled to a second power supply voltage terminal.

17. The pulse stretcher of claim 10, wherein said delay circuit comprises at least one speed-up delay circuit, each speed-up delay circuit comprising:

a first inverter having an input coupled to said output of said dynamic latch, and an output;

an RC network having an input coupled to said output of said first inverter, and an output;

a second inverter having an input coupled to said output of said RC network, and an output;

a first pair of transistors coupled between a first power supply voltage terminal and said input of said second inverter, wherein said first pair of transistors comprises a first transistor having a control electrode for receiving said input signal in series with a second transistor having a control electrode coupled to said output of said second inverter; and a second pair of transistors coupled between said input of said second inverter and a second power supply voltage terminal, wherein said second pair of transistors comprises a third transistor having a control electrode coupled to said output of said second inverter in series with a fourth transistor having a control electrode for receiving said input signal.

18. A method for gating an input signal comprising:

receiving the input signal;

receiving a stop signal;

providing an intermediate signal in response to a predetermined logic operation between the input signal and said stop signal;

providing an output signal with no pulse, when a width of a pulse of said intermediate signal is less than a first amount;

providing said output signal with a pulse having a first pulse width that begins after a start of said pulse of said intermediate signal and ends at a predetermined delay after said start of said pulse of said intermediate signal, when a pulse width of said intermediate signal is greater than said first amount but less than a second amount; and providing said output signal with a pulse having a second pulse width that begins after said start of said pulse of said intermediate signal and ends after an end of said pulse of said intermediate signal, when a pulse width of said intermediate signal is greater than said second amount.

19. The method of claim 18 wherein said providing said intermediate signal comprises:

providing said intermediate signal in response to a logical AND operation between said input signal and said stop signal.

20. The method of claim 18, wherein providing said output signal comprises:

selectively inverting said intermediate signal in response to a control signal to provide a selectively inverted signal;

statically latching said selectively inverted signal to provide a statically latched signal;

filtering said selectively inverted signal and said statically latched signal using a metastability filter to provide first and second outputs in complementary logic states in response to at least a predetermined difference in voltage between said selectively inverted signal and said statically latched signal, and in a predetermined logic state otherwise;

dynamically latching said first and second outputs to provide said output signal; and delaying said output signal to form said control signal.

\* \* \* \* \*